(12) United States Patent
Kishino (10) Patent No.: US 7,405,632 B2
(45) Date of Patent: Jul. 29, 2008

(54) VOLTAGE-CONTROLLED OSCILLATOR, TRANSMITTER, AND RECEIVER

(75) Inventor: Yusuke Kishino, Kashiba (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 113 days.

(21) Appl. No.: 11/589,774

(22) Filed: Oct. 31, 2006

(65) Prior Publication Data

US 2007/0132524 A1    Jun. 14, 2007

(30) Foreign Application Priority Data

Dec. 12, 2005  (JP) .............................. 2005-358268

(51) Int. Cl.
*H03B 5/08* (2006.01)
*H03B 5/10* (2006.01)
*H03B 5/12* (2006.01)

(52) U.S. Cl. .................. 331/175; 331/117 R; 331/167; 331/177 V; 331/179

(58) Field of Classification Search ............... 331/36 C, 331/36 L, 117 R, 117 FE, 117 D, 167, 175, 331/177 R, 177 V, 179
See application file for complete search history.

(56) References Cited

U.S. PATENT DOCUMENTS 5,434,543 A  *  7/1995  Brilka et al. ............ 331/117 R
6,954,111 B2    10/2005  Muramatsu et al.

FOREIGN PATENT DOCUMENTS

JP    2002-151953 A    5/2002
JP    2003-229718 A    8/2003

* cited by examiner

*Primary Examiner*—David Mis
(74) *Attorney, Agent, or Firm*—Birch, Stewart, Kolasch & Birch, LLP (57) ABSTRACT

A voltage-controlled oscillator includes (i) a first variable-capacity element, (ii) a resonance circuit whose resonance frequency changes in accordance with a control voltage applied to the first variable-capacity element, (iii) a second variable-capacity element connected in parallel with the first variable-capacity element, (iv) resonance frequency range switching means which switches the variation range of the resonance frequency of the resonance circuit by switching the capacity of the second variable-capacity element, and (v) a resonance frequency correction circuit which corrects the resonance frequency in such a manner as to prevent the ratio between resonance frequencies before and after the switching of the variation range from depending on the control voltage.

13 Claims, 6 Drawing Sheets

VOLTAGE-CONTROLLED OSCILLATOR, TRANSMITTER, AND RECEIVER

This Nonprovisional application claims priority under 35 U.S.C. § 119(a) on Patent Application No. 358268/2005 filed in Japan on Dec. 12, 2005, the entire contents if which are hereby incorporated by reference.

FIELD OF THE INVENTION

The present invention relates to a voltage-controlled oscillator, and particularly to a voltage-controlled oscillator which can switch and control the variation range of oscillating frequencies.

BACKGROUND OF THE INVENTION

In recent years voltage-controlled oscillators (VCOs), which can control oscillating frequencies by applying a control voltage, have widely been used for, for example, local oscillators of wireless transmitter-receivers. Such a voltage-controlled oscillator is required to be highly stable, have low phase noise, generate low noise, or the like. However, since the range of oscillating frequencies of a wireless transmitter-receiver is wide, the aforesaid requirements cannot be satisfied by a single voltage-controlled oscillator. Taking into account of this, a plurality of voltage-controlled oscillators with different variation ranges of oscillating frequencies are provided on one integrated circuit, in order to cover a required oscillating frequency range.

In case where a plurality of voltage-controlled oscillators are provided on an integrated circuit, the chip size increases on account of an area for those oscillators, so that the cost is high. Taking account of this problem, there is a voltage-controlled oscillator which can cover a required oscillating frequency range as if different voltage-controlled oscillators are provided. In this voltage-controlled oscillator, variation ranges of oscillating frequencies are switched by switching the inductance of a resonance circuit.

Figure 5:
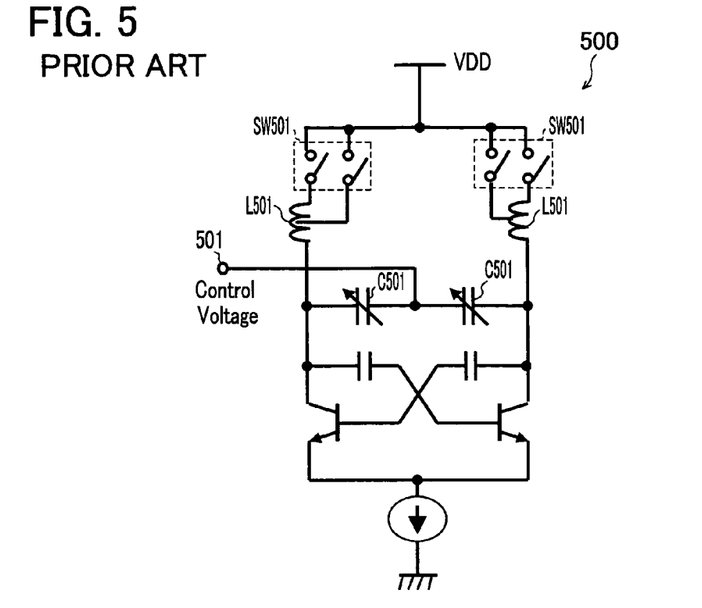
FIG. 5 relates to a conventional art, and is a circuit diagram which outlines a voltage-controlled oscillator capable of switching inductance.

FIG. 5 is a circuit diagram which outlines a voltage-controlled oscillator 500 with the inductance switching capability. This voltage-controlled oscillator 500 is disclosed in Japanese Laid-Open Patent Application No. 2003-229718 (published on Aug. 15, 2003; corresponding to U.S. Pat. No. 6,954,111). As illustrated in FIG. 5, the voltage-controlled oscillator 500 includes a pair of variable-capacity elements C501 whose capacity control terminals are connected to a control voltage input terminal 501. To this control voltage input terminal 501, a control voltage is applied from the outside. With this, the capacities of the variable-capacity elements C501 are changed, so that the resonance frequency of a resonance circuit including inductors L501 and variable-capacity elements C50-1 is controlled. Moreover, the voltage-controlled oscillator 500 includes switches SW501 by which a power source 502 is connected to either terminals of the inductors L501 or intermediate parts of the inductors L501. In this voltage-controlled oscillator 500, the inductance of the resonance circuit is varied by switching the switches SW501, with the result that the variation range of oscillating frequencies is switched.

Figure 6:
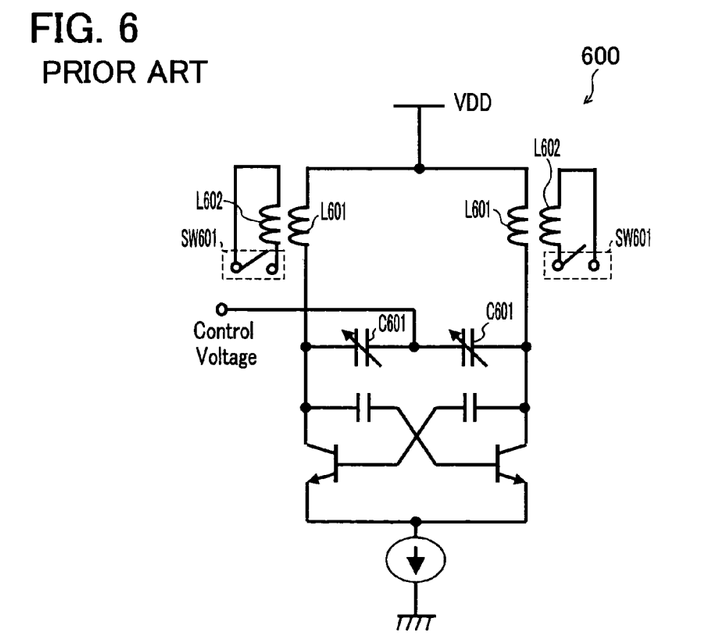
FIG. 6 relates to a conventional art, and is a circuit diagram which outlines another voltage-controlled oscillator capable of switching inductance.

FIG. 6 is a circuit diagram which outlines another voltage-controlled oscillator 600 having the inductance switching capability. This oscillator 600 is disclosed in Japanese Laid-Open Patent Application No. 2002-151953 (published on May 24, 2002). As illustrated in FIG. 6, the voltage-controlled oscillator 600 includes a pair of variable-capacity elements C601 whose capacity control terminals are connected to a control voltage input terminal 601. A control voltage is applied to the control voltage input terminal 601 from the outside, so that the capacities of the variable-capacity elements C601 are varied. In doing so, the resonance frequency of the resonance circuit including inductors L601 and the variable-capacity elements C601 is controlled. Furthermore, as shown in FIG. 6, each main inductor L601 is provided with an auxiliary inductor L602 which is magnetically coupled with the main inductor L601. On this account, in the voltage-controlled oscillator 600, the inductance of the resonance circuit is changed by switching on/off the switches SW601 which are connected to the closed circuit including the auxiliary inductors L602, so that the variation range of the oscillating frequencies is switched.

However, the conventional voltage-controlled oscillator in which the variation range of the oscillating frequencies is switched by switching the inductance of the resonance circuit has the following problem.

That is, in the voltage-controlled oscillator 500, the switches SW501 and the inductors L501 are connected in series. On this account, the currents passing through the switches SW501 and the inductors L501 are susceptible to a parasitic capacity and noise, and hence the phase noise characteristic is deteriorated and noise is increased.

In the meanwhile, in the voltage-controlled oscillator 600, the auxiliary inductors L602 by which mutual magnetic induction with the main inductors L601 is generated are required, in addition to the main inductors L601. For this reason, the voltage-controlled oscillator 600 requires an area where the inductors L601 and L602 are provided, and hence the chip size is large. To solve this problem, there has been a proposal to provide two or more wiring layers where those inductors are formed. In this case, however, it is necessary to provide, between the neighboring wiring layers, a ground layer (termed ground shield) made of polysilicon or the like. This increases manufacturing costs.

Figure 7:
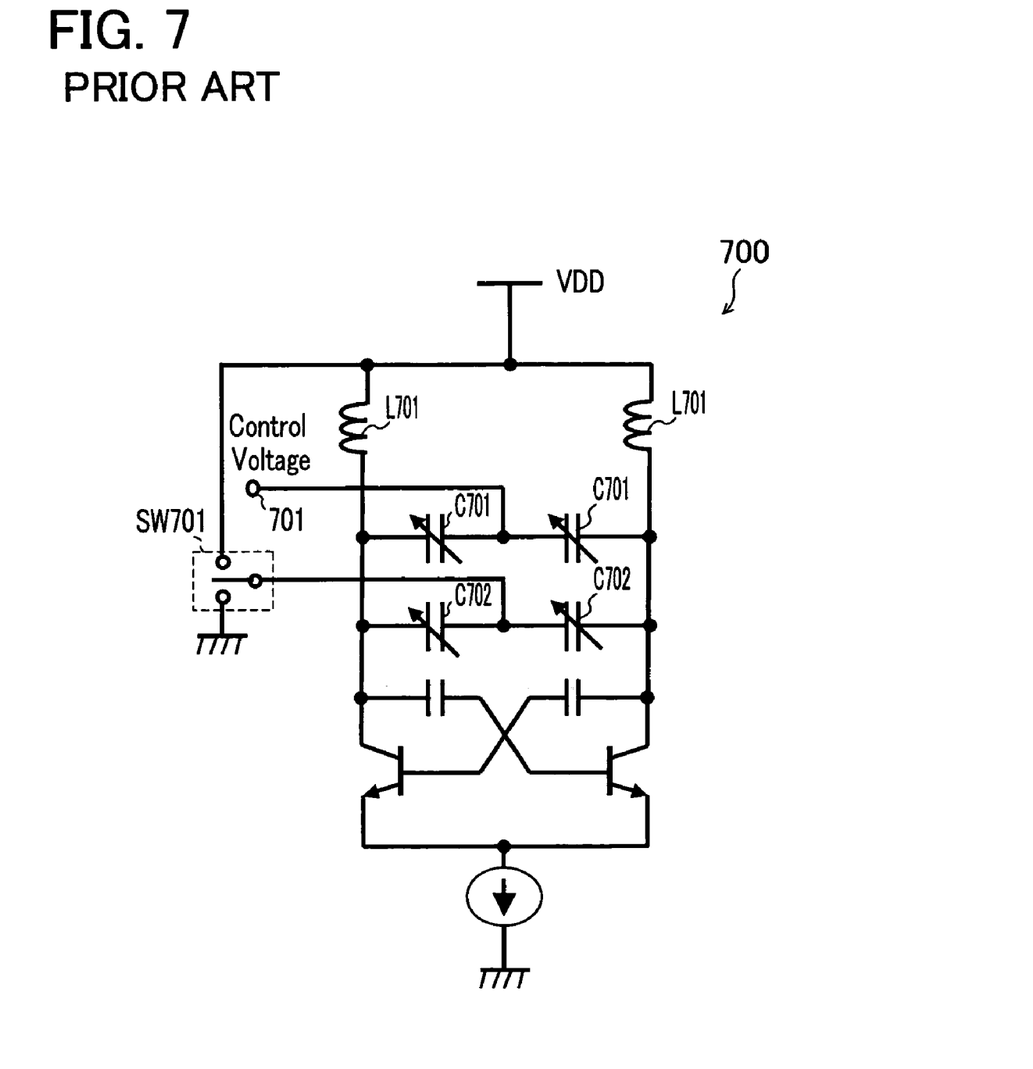
FIG. 7 relates to a conventional art, and is a circuit diagram which outlines a voltage-controlled oscillator capable of switching capacity.

In consideration of the above, there has been a voltage-controlled oscillator in which the variation range of the oscillating frequencies is switched by switching the capacity of the resonance circuit. FIG. 7 is a circuit diagram which outlines a voltage-controlled oscillator 700 having a capability of switching the capacity of a resonance circuit. As shown in this figure, the voltage-controlled oscillator 700 includes a pair of variable-capacity elements C701 whose capacity control terminals are connected to a control voltage input terminal 701. As the control voltage input terminal 701 receives a control voltage, the capacities of the variable-capacity elements C701 are changed, so that the resonance frequency of the resonance circuit including inductors L701 and the variable-capacity elements C701 is controlled. Furthermore, the voltage-controlled oscillator 700 is also provided with another pair of variable-capacity elements C702. The capacity control terminal of each of the variable-capacity elements C702 is connected to either the GND or the power source, via the switch SW701. With this arrangement, the capacities of the variable-capacity elements C702 are switched by a switch SW701, so that the variation range of the oscillating frequencies is switched.

The voltage-controlled oscillator 700 does not require an inductor for switching the variation range of the oscillating frequencies. For this reason, the voltage-controlled oscillator has a good phase noise characteristic can be easily downsized.

The voltage-controlled oscillator, in which the variation range of the oscillating frequencies is switched by switching the capacity of the resonance circuit, has a good phase noise characteristic and can be easily downsized, but has a problem such that the ratio between the oscillating frequencies before and after the switching of the variation range of the resonance frequency is not constant, because of the dependency on the control voltage. When such a voltage-controlled oscillator is used as a local oscillator of a transmitter or a receiver, the transmitter or the receiver requires complicated circuitry, and hence is costly.

The above-mentioned problem is specifically described as below, taking the voltage-controlled oscillator 700 shown in FIG. 7 as an example.

The resonance circuit of the voltage-controlled oscillator 700 is constituted by inductors L701, variable-capacity elements C701 which are connected in parallel with the inductors L701, and other variable-capacity elements C702. The total capacity C of the resonance circuit is therefore equal to $C_V + C_X$, which is the sum total of (i) the capacity $C_V$ of the variable-capacity elements C701, which is determined by a control voltage Vc applied to a control voltage input terminal 701 and (ii) the capacity $C_X$ of the variable-capacity elements C702.

As described above, the capacity $C_X$ of the variable-capacity elements C702 is switchable using the switch SW701. That is, in case where the capacity control terminal of the variable-capacity elements C702 is grounded, the capacity of the variable-capacity elements C702 is $C_A$. On the other hand, in case where the capacity control terminal of the variable-capacity elements C702 is connected to the power source, the capacity of the variable-capacity elements C702 is $C_B (C_A > C_B)$.

The oscillating frequency of the voltage-controller oscillator, i.e. the resonance frequency f of the resonance circuit is determined as below, by the total capacity C of the resonance circuit and the inductance L of the resonance circuit:

$$f = \frac{1}{2\pi\sqrt{L \cdot C}}$$

Therefore, when the capacity of the variable-capacity elements C702 is $C_A$, the resonance frequency $f_A$ of the voltage-controlled oscillator 700 is determined as below:

$$f_A = \frac{1}{2\pi\sqrt{L \cdot (C_V + C_A)}}$$

In the meanwhile, when the capacity of the variable-capacity element is $C_B$, the resonance frequency $f_B$ of the voltage-controlled oscillator 700 is determined as below:

$$f_B = \frac{1}{2\pi\sqrt{L \cdot (C_V + C_B)}}$$

In the equations above, indicated by L is the inductance of the inductors L701.

When the variation range of the resonance frequency is switched while the control voltage Vc is kept constant, the ratio between the resonance frequencies $f_A/f_B$ before and after the switching is represented as below.

$$\frac{f_A}{f_B} = \sqrt{\frac{C_V + C_B}{C_V + C_A}}$$

In this manner, the ratio between the resonance frequencies before and after the switching of the resonance frequency range depends on the capacity $C_V$, i.e. the control voltage Vc. The ratio is therefore inconstant.

The present invention was done to solve the above-described problem. The objective of the present invention is to provide a voltage-controlled oscillator (i) which has a good phase noise characteristic, (ii) which can be easily downsized, and (iii) whose ratio of oscillating frequencies before and after the switching of the variation range of a resonance frequency does not depend on a control voltage.

SUMMARY OF THE INVENTION

The objective of the present invention is to provide a voltage-controlled oscillator which has a good phase noise characteristic, which can be easily downsized, and whose ratio between oscillating frequencies before and after the switching of the variation range of the resonance frequency which does not depend on a control voltage.

To achieve the objective above, the voltage-controlled oscillator of the present invention includes: a resonance circuit which includes a first variable-capacity element, a resonance frequency of the resonance circuit being changed in accordance with a control voltage applied to the first variable-capacity element; resonance frequency range switching section which includes a second variable-capacity element connected in parallel with the first variable-capacity element, the resonance frequency range switching section switching a variation range of the resonance frequency of the resonance circuit by switching capacity of the second variable-capacity element; and resonance frequency correcting means which corrects the resonance frequency in such a manner as to prevent a ratio between resonance frequencies before and after switching the variation range of the resonance frequency from depending on the control voltage.

According to this arrangement, the oscillating frequency of the voltage control circuit varies in accordance with the resonance frequency of the resonance circuit, and hence the oscillating frequency of the voltage control circuit can be controlled by the control voltage. Also, the variation range of the oscillating frequency can be switched by the resonance frequency range switching section.

Moreover, according to the arrangement above, the variation range of the resonance frequency is switched by switching the capacity of the second variable-capacity element. In other words, the switching of the variation range is achieved without series connection to an inductor. A good phase noise characteristic of the voltage-controlled oscillator is therefore obtained. Furthermore, since the variation range of the resonance frequency is switched without auxiliary inductance, it is possible to downsize the voltage-controlled oscillator.

In addition to the above, on account of the resonance frequency correction section, it is possible to provide a voltage-controlled oscillator in which the ratio of resonance frequencies before and after the switching of the variation range of the resonance frequency which does not depend on the control voltage.

Additional objects, features, and strengths of the present invention will be made clear by the description below. Further, the advantages of the present invention will be evident from the following explanation in reference to the drawings.

DESCRIPTION OF THE EMBODIMENTS

The following will describe an embodiment of the present invention in reference to FIGS. 1-4.

Figure 1:
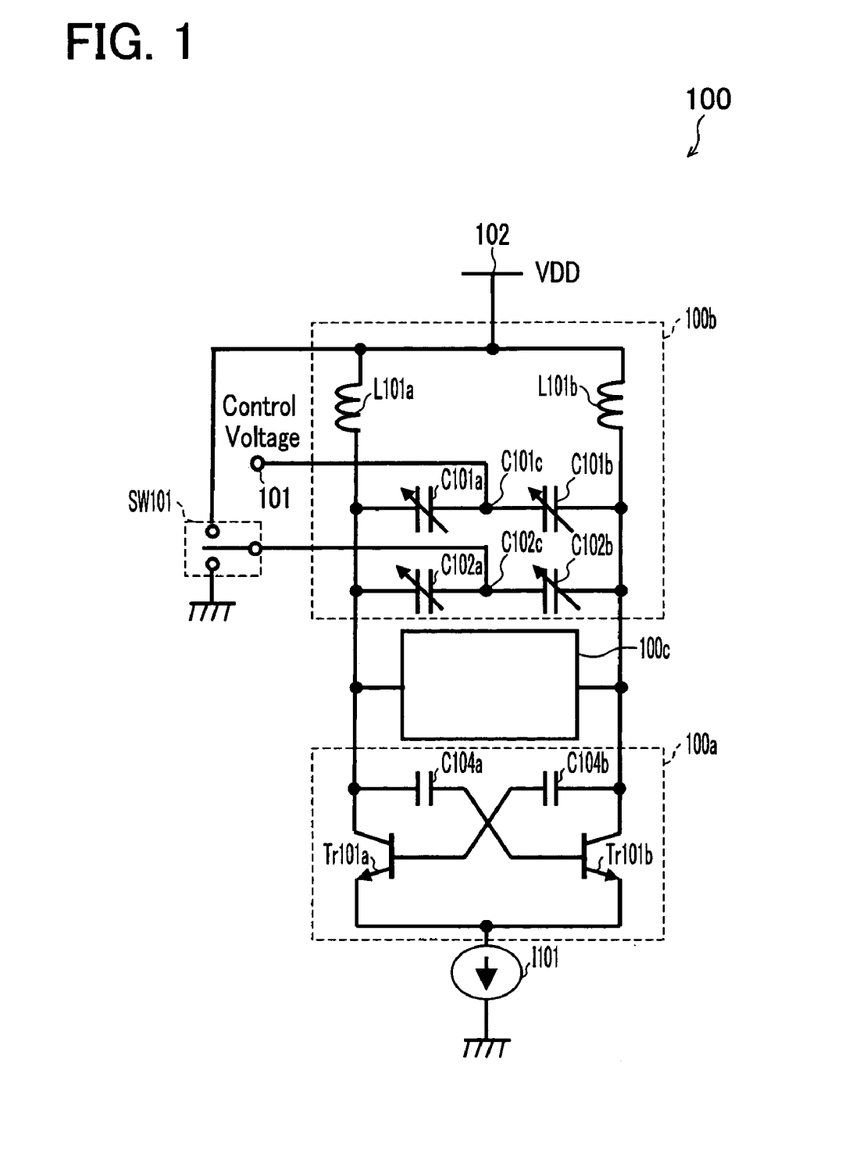
FIG. 1 is a circuit block diagram which outlines a voltage-controlled oscillator of the present invention.

First, a voltage-controlled oscillator 100 of the embodiment of the present invention will be described in reference to FIG. 1. FIG. 1 is a circuit block diagram which outlines the voltage-controlled oscillator 100. The voltage-controlled oscillator 100 basically includes an amplifier circuit 100a, a resonance circuit 100b, and a resonance frequency correction circuit 100c, so that oscillation is performed by feeding the output of the amplifier 100a back to the amplifier circuit 100a via the resonance circuit 100b.

The amplifier circuit 100a of the voltage control circuit 100 includes a pair of transistors Tr101a and Tr101b. These transistors Tr101a and Tr101b constitute a differential pair. As shown in FIG. 1, the emitters of the transistors Tr101a and Tr101b are grounded via a shared current source I101. The collector of the transistor Tr101a is connected to the base of the transistor Tr101b, via a fixed capacity element C104a. Similarly, the collector of the transistor Tr101b is connected to the base of the transistor Tr101a, via a fixed capacity element C104b.

The collectors of the transistors Tr101a and Tr101b of the amplifier 100a are connected to the resonance circuit 100b. As shown in FIG. 1, the resonance circuit 100b of the voltage-controlled oscillator 100 is an LC resonance circuit including inductors and variable-capacity elements. More specifically, the resonance circuit 100b includes inductors L101a and L101b, variable-capacity elements C101a and C101b connected in parallel with the inductors L101a and L101b, and variable-capacity elements C102a and C102b. The inductors of the resonance circuit 100b include a pair of inductors L101a and L101b connected in series with one another. The middle point between the inductors L101a and L101b receives a power source voltage VDD.

The variable-capacity elements C101a and C101b are used for changing the resonance frequency of the resonance circuit 100b, by means of a control voltage. A capacity control terminal C101c of the variable-capacity elements C101a and 101b connected to one another is connected to the control voltage input terminal 101. With this, the capacity control terminal C101c can receive the control voltage Vc from the outside. Therefore, the resonance frequency of the resonance circuit 100b can be controlled by changing the capacity $C_V$ of the variable-capacity elements C101a and C101b by applying the control voltage Vc to the control voltage input terminal 101. That is, the resonance circuit 100b includes the variable-capacity elements C101a and C101b, and functions as a resonance circuit in which the resonance frequency changes in accordance with the control voltage applied to the variable-capacity elements C101a and C101b.

The variable-capacity elements C101a and C102b are used for switching the variation range of the resonance frequency (i.e. resonance frequency range). A capacity control terminals C102c of the variable-capacity elements C102a and C102b connected to one another is connected to a switch SW101. The switch SW101 is a single-pole double-throw switch, and has two terminals in addition to the terminal connected to the capacity control terminal C102c. One of these two terminal is grounded, whereas the other one is connected to a power source 102. The switch SW101 can therefore determine whether the capacity control terminal C102c of the variable-capacity elements C102a and C102b is grounded or connected to the power source 102. On this account, in accordance with the state of the switch SW101, the capacity $C_X$ of the variable-capacity elements C102a and C102b is switched in a binary manner. That is, the switch SW101 is switched so that either a ground potential or a power source voltage VDD is supplied to the capacity control terminal C102c. As a result of this, the capacity of the variable-capacity elements C102a and C102b is $C_A$ when the capacity control terminal C102c is grounded, whereas the capacity of the variable-capacity elements C102a and C102b is $C_B$ ($C_A > C_B$) when the capacity control terminal C102c is connected to the power source 102. In this manner, the variable-capacity elements C102a and C102b and the switch SW101 function as means for switching the variation range of the resonance frequency of the resonance circuit 100b (i.e. functioning as a resonance frequency range switch section).

The capacity C of the resonance circuit 100b is $C_V + C_X$, i.e. the sum total of (i) the capacity $C_V$ of the variable-capacity elements C101a and C101b, which capacity is determined by the control voltage Vc and (ii) the capacity $C_X$ of the variable-capacity elements C102a and C102b.

When the capacity control terminal C102c of the variable-capacity elements C102a and C102b is grounded, i.e. when the capacity $C_X$ of the variable-capacity elements C102a and C102b is $C_A$, the resonance frequency $f_A$ of the resonance circuit 100b is determined as follows:

$$f_A = \frac{1}{2\pi\sqrt{L \cdot (C_V + C_A)}}$$

In the equation above, indicated by L is the inductance of the inductors L101a and L101b. In case where the control voltage Vc is changed while the capacity control terminal C102c of the variable-capacity elements C102a and C102b is grounded, the resonance frequency of the resonance circuit 100b continuously changes within a particular variation range, in accordance with the above-described equation.

On the other hand, when the capacity control terminal C102c of the variable-capacity elements C102a and C102b is connected to the power source 102, i.e. when the capacity $C_X$ of the variable-capacity elements is $C_B$, the resonance frequency $f_B$ of the resonance circuit 100b is determined as below:

$$f_B = \frac{1}{2\pi\sqrt{L \cdot (C_V + C_B)}}$$

In case where the control voltage Vc is changed while the capacity control terminal C102c of the variable-capacity elements C102a and C102b is connected to the power source 102, the resonance frequency of the resonance circuit 100b continuously changes within a variation range different from the above, in accordance with the above-described equation.

When the resonance frequency range is switched while the control voltage Vc applied to the control voltage input terminal 101 is kept constant, the ratio $f_A/f_B$ between the resonance frequencies before and after the switching of the resonance frequency range is determined as follows:

$$\frac{f_A}{f_B} = \sqrt{\frac{C_V + C_B}{C_V + C_A}}$$

Since the capacity $C_V$ of the variable-capacity elements C101a and C101b is determined in dependence upon the control voltage Vc, the ratio $f_A/f_B$ between the resonance frequencies before and after the switching of the resonance frequency range depends on the control voltage Vc, so as not be constant.

However, the voltage-controlled oscillator 100 characteristically includes the resonance frequency correction circuit 100c. The resonance frequency correction circuit 100c corrects the resonance frequency of the resonance circuit 100b in such a manner as to prevent the ratio of the oscillating frequencies before and after the switching of the resonance frequency variation range from depending on the control voltage Vc. That is, the resonance frequency correction circuit 100c functions as means for correcting the resonance frequency so as to prevent the ratio of the oscillating frequencies before and after the switching of the resonance frequency variation range from depending on the control voltage Vc (i.e. functioning as a resonance frequency correction section).

When the capacity control terminal C102c of the variable-capacity elements C102a and C102b is grounded, the resonance frequency $f_A'$ of the voltage-controlled oscillator 100 including the resonance frequency correction circuit 100c is determined as follows, on account of the resonance frequency correction circuit 100c:

$$f_A' = \frac{1}{2\pi\sqrt{L \cdot (C_V + C_A)}} + F_A$$

When the capacity control terminal C102c of the variable-capacity elements C102a and C102b is connected to the power source 102, the resonance frequency $f_B'$ of the voltage-controlled oscillator 100 including the resonance frequency correction circuit 100c is determined as follows:

$$f_B' = \frac{1}{2\pi\sqrt{L \cdot (C_V + C_B)}} + F_B$$

In the equation above, indicated by $F_A$ and $F_B$ are correction terms for the resonance frequency, by the resonance frequency correction circuit 100c. Also, the above-described equation is arranged to satisfy the following equation:

$$\frac{f_A'}{f_B'} =$$

a constant value independent of the control voltage Vc

That is, because of the resonance frequency correction circuit 100c, the ratio between the resonance frequencies of the voltage-controlled oscillator 100 including the resonance frequency correction circuit 100c, i.e. the ratio $f_A'/f_B'$ of the oscillating frequencies is constant before and after the switching of the variation range of the resonance frequency, independently of the control voltage Vc.

Figure 2A:
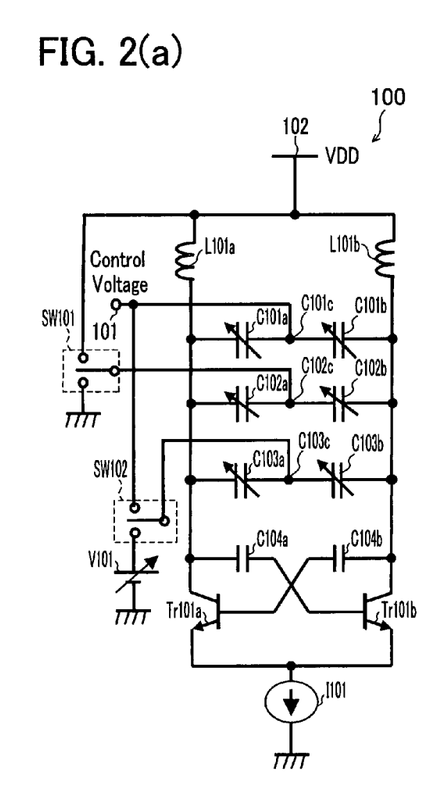
FIG. 2(a) is a circuit diagram of the voltage-controlled oscillator of the present invention, and specifically shows the circuitry of a resonance frequency correction circuit.
Figure 2B:
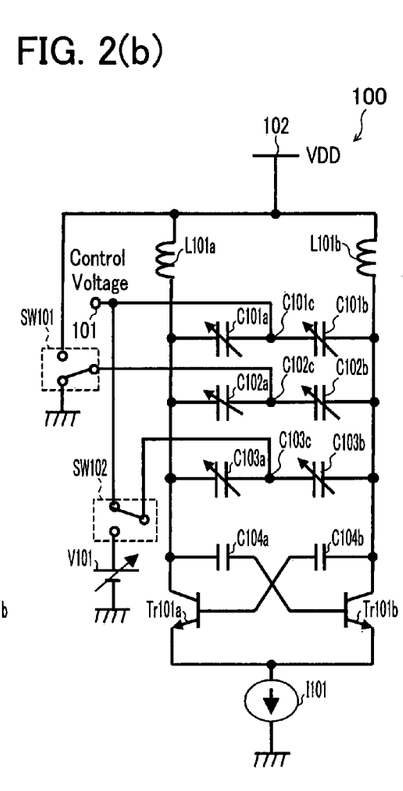
FIG. 2(b) is a circuit diagram of the voltage-controlled oscillator of the present invention, and specifically shows the circuitry of another resonance frequency correction circuit.
Figure 2C:
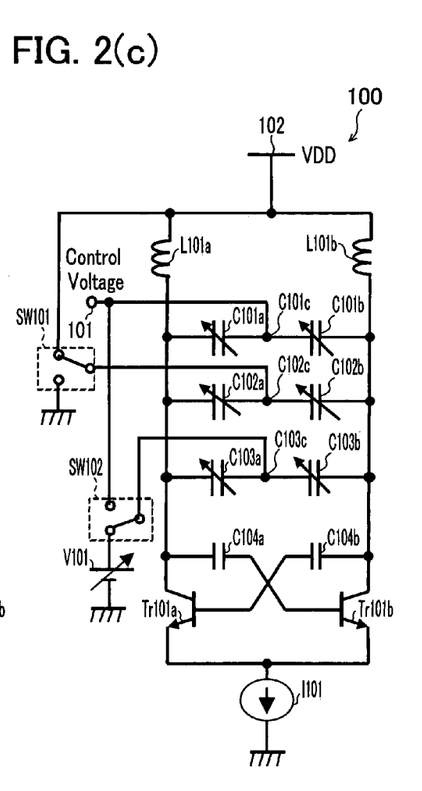
FIG. 2(c) is a circuit diagram of the voltage-controlled oscillator of the present invention, and specifically shows the circuitry of a further resonance frequency correction circuit.

Now, in reference to FIGS. 2(a)-2(c), the following will describe specific circuitry of the resonance frequency correction circuit 100c. FIGS. 2(a)-2(c) are circuit diagrams of the voltage-controlled oscillator 100 shown in FIG. 1, and show specific circuitry of the resonance frequency correction circuit 100c which is illustrated as a circuit block in FIG. 1.

As shown in FIG. 2(a), the resonance frequency correction circuit 100c includes a pair of variable-capacity elements C103a and C103b connected in parallel with the aforesaid variable-capacity elements C102a and C102b. A capacity control terminal C103c of the variable-capacity elements C103a and C103b connected to one another is connected to a switch SW102. The switch SW102 is a single-pole double-throw switch, and has two terminals in addition to the terminal connected to the capacity control terminal C103c. One of these two terminal is connected to a control voltage input terminal 101, whereas the other one is grounded via a voltage source V101. The switch SW102 can therefore determine whether the capacity control terminal C103c of the variable-capacity elements C103a and C103b is connected to the control voltage input terminal 101 or grounded via the voltage source V101. On this account, the switch SW102 is switched so that the capacity control terminal C103c of the variable-capacity elements C103a and C103b receives either a control voltage Vc or an output voltage V0 of the voltage source V101. In this manner, the capacity of the variable-capacity elements C103a and C103b is changed in a binary manner.

Before and after the switching of the resonance frequency range, the switches SW101 and SW102 operates together in such a manner as to cause the ratio between the resonance frequencies in the voltage control circuit 100 including the resonance frequency correction circuit 100c, i.e. the ratio $f_A'/f_B'$ of the oscillating frequencies to be constant independently of the control voltage Vc. More specifically, when the capacity control terminal C102c of the variable-capacity elements C102a and C102b is grounded by the switch SW101, the switch SW102 connects the capacity control terminal C103c of the variable-capacity elements C103a and C103b with the control voltage input terminal 101. On the other hand, when the capacity control terminal C102c of the variable-capacity elements C102a and C102b is connected to the power source 102 by the switch SW101, the switch SW102 causes the capacity control terminal C103c of the variable-capacity elements C103a and C103b to be grounded via the voltage source V101.

FIG. 2(b) illustrates the voltage-controlled oscillator 100 in which the capacity control terminal C102c of the variable-capacity elements C102a and C102b is grounded by the switch SW101 whereas the capacity control terminal C103 of the variable-capacity elements C103a and C103b is connected to the control voltage input terminal 101 by the switch SW102.

In case where the voltage-controlled oscillator 100 is arranged as shown in FIG. 2(b), the capacity of the variable-capacity elements C102a and C102b is $C_A$ as described above. In the meanwhile, the variable-capacity elements C103a and 103b are connected in parallel with the variable-capacity elements C101a and C101b, and receive the same control voltage Vc as the variable-capacity elements C101a and C101b. The capacity $C_Y$ of the variable-capacity elements C103a and C103b is therefore in proportion to the capacity $C_V$ of the variable-capacity elements C101a and C101b. In other words, the following equation is given:

$$C_Y = a \cdot C_V$$

In this equation, indicated by a is a positive constant (a>0).

Therefore, when the voltage-controlled oscillator 100 is arranged as shown in FIG. 2(b), the total capacity $C_A'$ of the voltage-controlled oscillator 100 is given by the following equation:

$$C_A' = C_A + C_V + a \cdot C_V$$

Therefore, when the voltage-controlled oscillator 100 is arranged as shown in FIG. 2(b), the resonance frequency $f_A'$ of the voltage-controlled oscillator 100 is given by the following equation:

$$f_A' = \frac{1}{2\pi\sqrt{L \cdot C_A'}} = \frac{1}{2\pi\sqrt{L(C_A + C_V + a \cdot C_V)}}$$

FIG. 2(c) shows the voltage-controlled oscillator 100 in which the capacity control terminal C102c of the variable-capacity elements C102a and C102b is connected to the power source 102 by the switch SW101 whereas the capacity control terminal C103c of the variable-capacity elements C103a and C103b is, by the switch SW102, grounded via the voltage source V101.

In case where the voltage-controlled oscillator 100 is arranged as shown in FIG. 2(c), the capacity of the variable-capacity elements C102a and C102b is $C_B$ as described above. On the other hand, the capacity of the variable-capacity elements C103a and C103b is a constant value Co which is determined in line with the output voltage V0 of the voltage source V101.

Therefore, when the voltage-controlled oscillator 100 is arranged as shown in FIG. 2(b), the total capacity $C_B'$ of the voltage-controlled oscillator 100 is given by the following equation:

$$C_B' = C_B + C_V + C_o$$

Therefore, when the voltage-controlled oscillator 100 is arranged as shown in FIG. 2(b), the resonance frequency $f_B'$ of the voltage-controlled oscillator 100 is given by the following equation:

$$f_B' = \frac{1}{2\pi\sqrt{L \cdot C_B'}} = \frac{1}{2\pi\sqrt{L(C_B + C_V + C_o)}}$$

On this account, the ratio $f_A'/f_B'$ between the resonance frequencies before and after the switching of the resonance frequency range is represented by the following equation:

$$\frac{f_A'}{f_B'} = \sqrt{\frac{C_B + C_V + C_o}{C_A + C_V + a \cdot C_V}}$$

The output voltage Vo of the voltage source V101 is set so that the constant a and the capacity Co satisfy the following equation:

$$C_o = \frac{C_A - C_B(1 + a)}{1 + a}$$

As a result, the ratio $f_A'/f_B'$ between the resonance frequencies before and after the switching of the variation range of the resonance frequency is given as follows:

$$\frac{f_A'}{f_B'} = \sqrt{\frac{1}{1 + a}}$$

In this manner, the ratio is a constant value independent of the control voltage Vc.

Figure 3A:
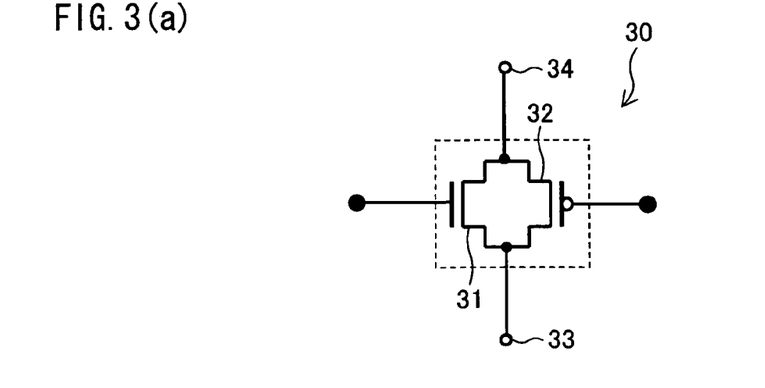
FIG. 3(a) is a circuit diagram of a switching element constituting a switch of the voltage-controlled oscillator of the present invention.
Figure 3B:
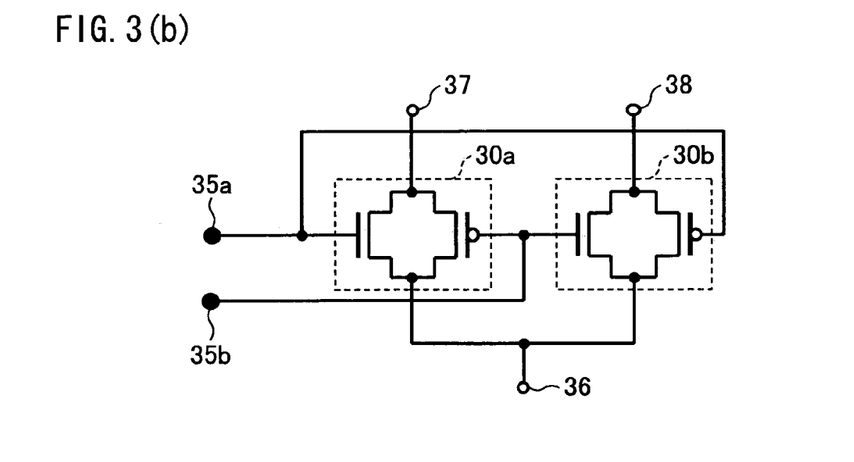
FIG. 3(b) is a circuit diagram of a switch of the voltage-controlled oscillator of the present invention, which switch is constituted by the switching elements shown in FIG. 3(a).
Figure 3C:
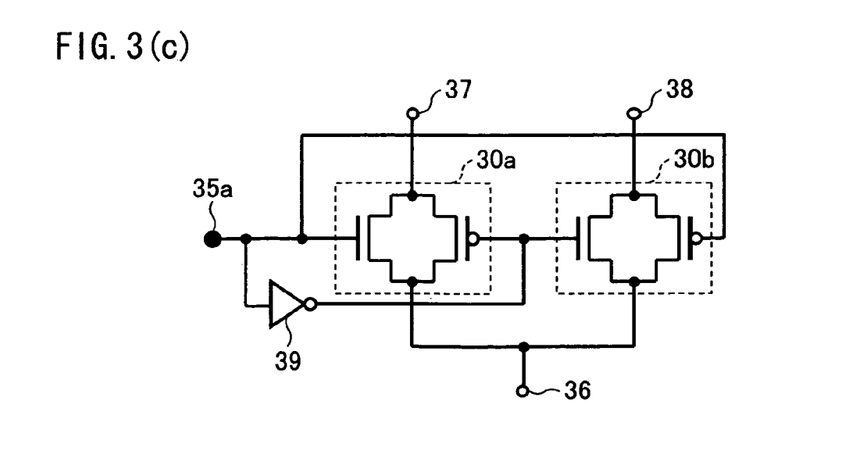
FIG. 3(c) is a circuit diagram of another switch of the voltage-controlled oscillator of the present invention, which switch is constituted by the switching elements shown in FIG. 3(a).

Now, the following will describe a switch which can be suitably used as the switch SW101 or SW102, in reference to FIGS. 3(a)-3(c).

FIG. 3(a) is a circuit diagram showing a switching element 30 constituting the switch SW101 or SW102. As shown in FIG. 3(a), the switching element 30 includes an NMOS transistor 31 and a PMOS transistor 32. The switching element 30 is switched, i.e. terminals 33 and 34 are connected/disconnected, by a control signal supplied from a control signal input terminal 35.

FIG. 3(b) shows a single-pole double-throw switch made up of switching elements 30a and 30b, which are equivalent to the above-described switching element. By the single-pole double-throw switch shown in FIG. 3(b), terminals 36 and 37 are connected/disconnected by a control signal supplied to a control signal input terminal 35a, whereas terminals 36 and 38 are connected/disconnected by a control signal supplied to a control signal input terminal 35b. On this account, the terminal 36 is connected to either the terminal 37 or the terminal 38, by applying, to the control signal input terminals 35a and 35b, control signals which are inverse to one another. The single-pole double-throw switch shown in FIG. 3(b) can therefore constitute the switch SW101 or SW102.

FIG. 3(c) is a variant example of the single-pole double-throw switch shown in FIG. 3(b). Since an inverter 39 is provided, the single-pole double-throw switch in FIG. 3(c) can connect the terminal 36 with either the terminal 37 or the terminal 38, only by a single control signal. In the single-pole double-throw switch in FIG. 3(c), a control signal inputted to a single control signal input terminal 35c is supplied to a switching element 30a, whereas the control signal inverted by the inverter 39 is supplied to a switching element 30b. In other words, the single-pole double-throw switch shown in FIG. 3(c) is controlled by the control signal supplied to the control signal input terminal 35c and the inversion signal which is generated by inverting the control signal by the inverter.

In case where the single-pole double-throw switch of FIG. 3(b) or 3(c) is used as the switch SW101 or SW102 of the voltage-controlled oscillator 100, the control signal for controlling the switch may be a digital signal. In particular, when the single-pole double-throw switch of FIG. 3(c) is used as the switch SW101 or SW102, the switching is achieved by a single control signal. This makes it possible to simplify and downsize the circuitry for the switching.

Figure 4:
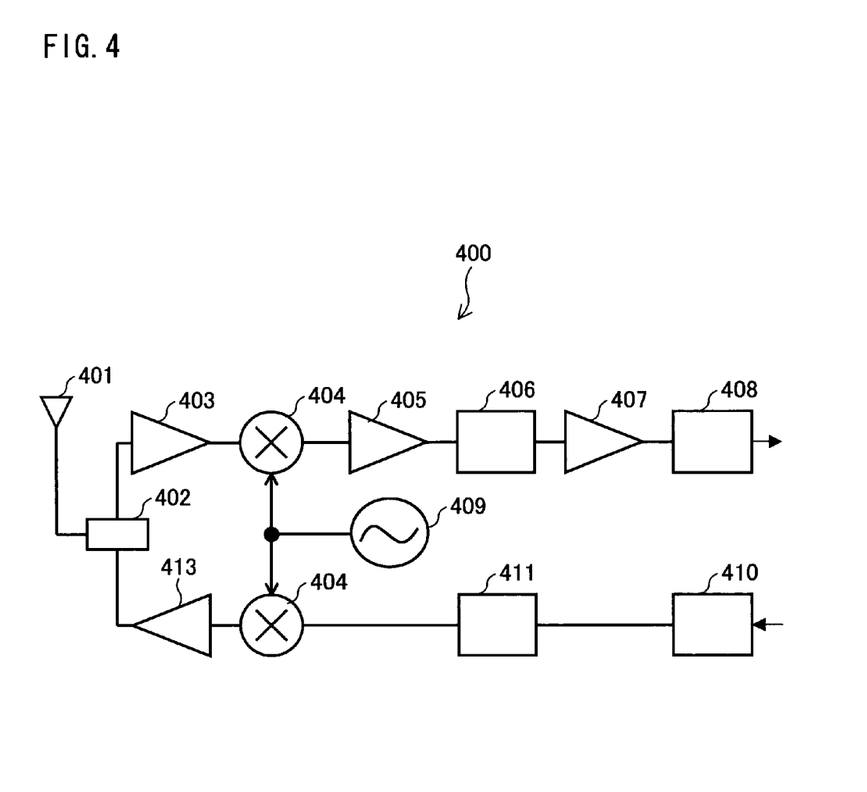
FIG. 4 is a circuit block diagram which outlines a transmitter-receiver including the voltage-controlled oscillator of the present invention.

The above-described voltage-controlled oscillator 100 can be suitably used as a local oscillator of a transmitter, receiver, or a transmitter-receiver. FIG. 4 is a circuit block diagram which outlines a transmitter-receiver 400 including, as a local oscillator, the voltage-controlled oscillator 100.

As shown in FIG. 4, the transmitter-receiver 400 includes members constituting a receiving circuit, and hence functions as a receiver. The members constituting the receiving circuit are a LNA (low noise amplifier) 403, a down mixer 404, a variable amplifier 405, a BPF (band pass filter) 406, an amplifier 407, and a demodulator 408. The transmitter-receiver 400 further includes members constituting a transmitting circuit, and hence functions as a transmitter. The members constituting the transmitting circuit are a modulator 410, a BPF (band pass filter) 411, an up mixer 412, and a power amplifier 413. The transmitter-receiver 400 further includes an antenna 401 and a switch 402 which switches the connection of the antenna 401 to either the transmitting circuit or the receiving circuit. The transmitter-receiver 400 also includes a down mixer 404 and a local oscillator 409 connected to the up mixer 412.

The antenna 401 receives an RF signal, and the RF signal is supplied to the LNA 403 via the switch 402. The LNA 403 amplifies the RF signal supplied from the antenna 401, and sends the signal to the down mixer 404. The down mixer 404 mixes the supplied RF signal with the output of the local oscillator 409, so that down-conversion is carried out. As a result, an IF signal is obtained. The IF signal is amplified by the variable amplifier 405, and an unnecessary frequency of the IF signal is cut off by the BPF 406. The signal from the BPF is further amplified by the amplifier 407. The amplified signal is supplied to the demodulator 408.

The IF signal is outputted from the demodulator 410, and an unnecessary frequency of the IF signal is cut off by the BPF 411. The IF signal is then supplied to the up mixer 412. The up mixer 412 mixes the supplied IF signal with the output of the local oscillator 409, so that up-conversion is carried out. As a result, an RF signal is obtained. This RF signal is amplified by the power amplifier 413, and then supplied to the antenna 401 via the switch 402. The antenna 401 outputs the RF signal.

As the local oscillator 409 of the transmitter-receiver 400, it is possible to use the voltage-controlled oscillator of the present invention, e.g. the voltage-controlled oscillator 100. In the voltage-controlled oscillator of the present invention, the ratio between the oscillating frequencies before and after the switching of the variation range of the oscillating frequencies does not depend on the control voltage. It is therefore possible to simplify the circuit design of a transmitter, receiver, or a transmitter-receiver, which includes, as a local oscillator, the voltage-controlled oscillator of the present invention. Furthermore, the voltage-controlled oscillator of the present invention does not require plural inductors, even if a wide oscillating frequency range is achieved. It is therefore possible to provide a local oscillator which is small and inexpensive as compared to conventional local oscillators. In other words, in case where the voltage-controlled oscillator of the present invention is used as a local oscillator, a small and inexpensive transmitter, receiver, or transmitter-receiver is realized.

As described above, a typical voltage-controlled oscillator of the present invention includes: a first variable-capacity element; a resonance circuit whose resonance frequency varies in accordance with a control voltage applied to the first variable-capacity element; a second variable-capacity element connected in parallel with the first variable-capacity element; resonance frequency range switching means (e.g. a resonance frequency range switching circuit) which switches the variation range of the resonance frequency of the resonance circuit by switching the capacity of the second variable-capacity element; and resonance frequency correcting means (e.g. a resonance frequency correction circuit) which corrects the resonance frequency in such a manner as to prevent the ratio between resonance frequencies before and after the switching of the variation range of the resonance frequency from depending on the control voltage.

According to this arrangement, the oscillating frequency of the voltage control circuit varies in accordance with the resonance frequency of the resonance circuit, and hence the oscillating frequency of the voltage control circuit can be controlled by the control voltage. Also, the variation range of the oscillating frequency can be switched by the resonance frequency range switching section.

Moreover, according to the arrangement above, the variation range of the resonance frequency is switched by switching the capacity of the second variable-capacity element. In other words, a switch for switching the inductance of the resonance circuit is constructed without series connection to an inductor. A good phase noise characteristic of the voltage-controlled oscillator is therefore obtained. Furthermore, since the variation range of the resonance frequency is switched without auxiliary inductance, it is possible to downsize the voltage-controlled oscillator.

In addition to the above, on account of the resonance frequency correction section, it is possible to provide a voltage-controlled oscillator in which the ratio of resonance frequencies before and after the switching of the variation range of the resonance frequency does not depend on the control voltage.

The above-described voltage-controlled oscillator is preferably arranged such that the resonance frequency correcting means includes a third variable-capacity element connected in parallel with the second variable-capacity element, and the resonance frequency is corrected by switching the capacity of the third variable-capacity element.

According to this arrangement, the resonance frequency is corrected by switching the capacity of the variable-capacity element. That is, the correction of the resonance frequency is achieved without switching the inductance of the resonance circuit. On this account, it is possible to provide a voltage-controlled oscillator which has a good phase noise characteristic, which is small in size, and whose ratio between resonance frequencies before and after the switching of the variation range of the resonance frequency does not depend on the control voltage.

The above-described voltage-controlled oscillator is preferably arranged such that the resonance frequency correcting means includes a switch that operates together with the resonance frequency range switching means so as to determine whether the third variable-capacity element receives the control voltage or a constant output voltage supplied from a voltage source.

According to this arrangement, the resonance frequency correcting means is constituted by a variable-capacity element, a switch, and a voltage source. It is therefore possible to construct the resonance frequency correcting means with a small number of components and a simple circuit design. On this account, it is possible to provide a voltage-controlled oscillator which is inexpensive and whose ratio between resonance frequencies before and after the switching of the variation range of the resonance frequency does not depend on the control voltage.

The above-described voltage-controlled oscillator is preferably arranged such that the switch includes a transistor.

According to this arrangement, the switching capability to connect/disconnect a current is achieved by the transistor. Since the switching capability is achieved by the transistor, it is possible to realize the downsizing and cost reduction of the resonance frequency correcting means. Also, since the switching capability is achieved by the transistor, it is possible to use a digital signal as the control signal by which the switch is controlled.

The transistor may be a MOS field effect transistor. The switch may be a single-pole double-throw switch made up of a NMOS transistor and a PMOS transistor.

The above-described voltage-controlled oscillator is preferably arranged such that the switch is controlled by a control signal which is a digital signal and an inverse signal which is generated by inverting the control signal by an inverter.

According to this arrangement, a single-pole double-throw switch constituted by a transistor is switched and controlled by a single control signal and an inverse signal generated from the control signal. Moreover, since the inverse signal is generated by an inverter, the circuitry for the switching and control of the switch is simplified, so that the downsizing and cost-reduction of the voltage-controlled oscillator is achieved.

The above-described voltage-controlled oscillator is preferably arranged such that the resonance circuit includes an inductor. As described above, the resonance circuit includes the first variable-capacity element. An LC resonance circuit is therefore constructed because an inductor is included.

The above-described voltage-controlled oscillator may be arranged such that the resonance frequency range switching means includes a switch connected to a terminal of the second variable-capacity element. That is, a specific example of the resonance frequency range switching means is a resonance frequency range switching circuit including the second variable-capacity element and the switch.

Another voltage-controlled oscillator of the present invention includes: a resonance circuit whose resonance frequency changes in accordance with a control voltage applied to a variable-capacity element, the resonance circuit including a resonance frequency range switching circuit which is connected in parallel with the variable capacity element and switches a variation range of the resonance frequency of the resonance circuit; and a resonance frequency correction circuit which corrects the resonance frequency in such a manner as to prevent a ratio between resonance frequencies before and after switching the variation range from depending on the control voltage.

According to this arrangement, a good phase noise characteristic is obtained, downsizing is easily achieved, and the ratio of resonance frequencies before and after the switching of the variation range of the resonance frequency does not depend on the control voltage.

The above-described voltage-controlled oscillator is preferably arranged such that, provided that a variable-capacity element in the resonance circuit, which element contributes to a variation of the resonance frequency, is a first variable-capacity element, the resonance frequency range switching circuit includes (i) a second variable-capacity element connected in parallel with the first variable-capacity element and (ii) a switch that switches capacity of the second variable-capacity element.

The above-described voltage-controlled oscillator is preferably arranged such that, the resonance frequency correction circuit includes a third variable-capacity element connected in parallel with the second variable-capacity element, and the resonance frequency is corrected by switching capacity of the third variable-capacity element.

The above-described voltage-controlled oscillator is preferably arranged such that, the resonance frequency correction circuit includes a switch which operates together with the resonance frequency range switching circuit so as to determine whether the third variable-capacity element receives the control voltage or a constant output voltage supplied from a voltage source.

A transmitter or a receiver of the present invention includes, as a local oscillator, the above-described voltage-controlled oscillator.

The transmitter or receiver including the voltage-controlled oscillator does not require circuitry to prevent the ratio between resonance frequencies before and after the switching of the variation range of the resonance frequency from depending on the control voltage. It is therefore possible to provide a transmitter or a receiver which is inexpensive and has simple circuitry.

The present invention is not limited to the description of the embodiments above, but may be altered by a skilled person within the scope of the claims. An embodiment based on a proper combination of technical means disclosed in different embodiments is encompassed in the technical scope of the present invention.

What is claimed is:

1. A voltage-controlled oscillator, comprising:
   a resonance circuit which includes a first variable-capacity element, a resonance frequency of the resonance circuit being changed in accordance with a control voltage applied to the first variable-capacity element;
   resonance frequency range switching means which includes a second variable-capacity element connected in parallel with the first variable-capacity element, the resonance frequency range switching means switching a variation range of the resonance frequency of the resonance circuit by switching capacity of the second variable-capacity element; and
   resonance frequency correcting means which corrects the resonance frequency in such a manner as to prevent a ratio between resonance frequencies before and after switching the variation range of the resonance frequency from depending on the control voltage.

2. The voltage-controlled oscillator as defined in claim 1, wherein, the resonance frequency correcting means includes a third variable-capacity element which is connected in parallel with the second variable-capacity element, and the resonance frequency is corrected by switching capacity of the third variable-capacity element.

3. The voltage-controlled oscillator as defined in claim 2, wherein, the resonance frequency correcting means includes a switch that operates together with the resonance frequency range switching means so as to determine whether the third variable-capacity element receives the control voltage or a constant output voltage supplied from a voltage source.

4. The voltage-controlled oscillator as defined in claim 3, wherein, the switch includes a transistor.

5. The voltage-controlled oscillator as defined in claim 3, wherein, the switch is controlled by a control signal which is a digital signal and an inverse signal which is generated by inverting the control signal by an inverter.

6. The voltage-controlled oscillator as defined in claim 1, wherein, the resonance circuit includes an inductor.

7. The voltage-controlled oscillator as defined in claim 1, wherein, the resonance frequency range switching means includes a switch connected to a terminal of the second variable-capacity element.

8. A transmitter, comprising, as a local oscillator, the voltage-controlled oscillator defined in claim 1.

9. A receiver, comprising, as a local oscillator, the voltage-controlled oscillator defined in claim 1.

10. A voltage-controlled oscillator, comprising:
a resonance circuit whose resonance frequency changes in accordance with a control voltage applied to a variable-capacity element, the resonance circuit including a resonance frequency range switching circuit which is connected in parallel with the variable capacity element and switches a variation range of the resonance frequency of the resonance circuit; and
a resonance frequency correction circuit which corrects the resonance frequency in such a manner as to prevent a ratio between resonance frequencies before and after switching the variation range of the resonance frequency from depending on the control voltage.

11. The voltage-controlled oscillator as defined in claim 10,
wherein, provided that a variable-capacity element of the resonance circuit, which element contributes to a variation of the resonance frequency, is a first variable-capacity element, the resonance frequency range switching circuit includes (i) a second variable-capacity element connected in parallel with the first variable-capacity element and (ii) a switch that switches capacity of the second variable-capacity element.

12. The voltage-controlled oscillator as defined in claim 11,
wherein, the resonance frequency correction circuit includes a third variable-capacity element connected in parallel with the second variable-capacity element, and the resonance frequency is corrected by switching capacity of the third variable-capacity element.

13. The voltage-controlled oscillator as defined in claim 12,
wherein, the resonance frequency correction circuit includes a switch which operates together with the resonance frequency range switching circuit so as to determine whether the third variable-capacity element receives the control voltage or a constant output voltage supplied from a voltage source.

* * * * *